United States Patent
Chen et al.

(10) Patent No.: US 6,809,936 B2
(45) Date of Patent: Oct. 26, 2004

(54) INTEGRATED CIRCUIT COMPONENT CARRIER WITH ANGLED SUPPORTING AND RETAINING SURFACES

(75) Inventors: Song Ping Chen, GuangDong (CN); Ru Zheng Liu, Shenzhen (CN); Joo Yam Lau, Pasir Ris (SG)

(73) Assignee: e.PAK International, Inc., Austin, TX (US)

( * ) Notice: Subject to any disclaimer, the term of this patent is extended or adjusted under 35 U.S.C. 154(b) by 0 days.

(21) Appl. No.: 10/140,089

(22) Filed: May 7, 2002

(65) Prior Publication Data

US 2003/0147229 A1 Aug. 7, 2003

Related U.S. Application Data

(60) Provisional application No. 60/355,651, filed on Feb. 7, 2002.

(51) Int. Cl.[7] .............................. H05K 7/14; H05K 7/18
(52) U.S. Cl. ....................... 361/807; 361/761; 361/763; 361/764; 361/801; 439/68; 257/686; 257/711; 257/731; 174/52.4; 174/52.1
(58) Field of Search ................................ 361/760, 761, 361/763, 764, 807, 801–802, 735, 790, 783, 749; 439/68; 257/686, 711, 731, 710; 174/52.4, 52.1

(56) References Cited

U.S. PATENT DOCUMENTS

| | | | | |
|---|---|---|---|---|
| 3,270,355 A | * | 9/1966 | John ........................... 470/20 |
| 3,556,189 A | * | 1/1971 | Ernest ......................... 411/189 |
| 4,670,770 A | * | 6/1987 | Tai .............................. 257/777 |
| 5,205,032 A | * | 4/1993 | Kuroda et al. ................ 29/740 |
| 5,706,176 A | * | 1/1998 | Quinn et al. ................. 361/760 |
| 5,791,486 A | | 8/1998 | Brahmbhatt |
| 5,957,293 A | | 9/1999 | Pakeriasamy |
| 6,179,127 B1 | * | 1/2001 | Kato et al. ................... 206/714 |
| 6,366,468 B1 | * | 4/2002 | Pan ............................. 361/761 |
| 6,527,489 B2 | * | 3/2003 | Kando ......................... 411/107 |
| 6,536,593 B2 | * | 3/2003 | Hatakeyama ............... 206/714 |

* cited by examiner

*Primary Examiner*—Kamand Cuneo
*Assistant Examiner*—Thanh Y. Tran
(74) *Attorney, Agent, or Firm*—Carlson, Gaskey & Olds

(57) ABSTRACT

A carrier for handling integrated circuit components during storage and shipping includes a plurality of pocket portions each for supporting an individual component. The pocket portions include a base surface and a plurality of sidewalls defining the pocket generally. The sidewalls include support surfaces arranged at a first, oblique angle relative to the base surface. A plurality of retainer surfaces are associated with at least some of the support surfaces. The retainer surfaces extend at a second angle relative to the base surface. The retainer surfaces cooperate with the support surfaces to maintain the integrated circuit components within the pockets in a desired alignment throughout handling. One example includes guide surfaces that facilitate inserting the components into the pockets.

16 Claims, 6 Drawing Sheets

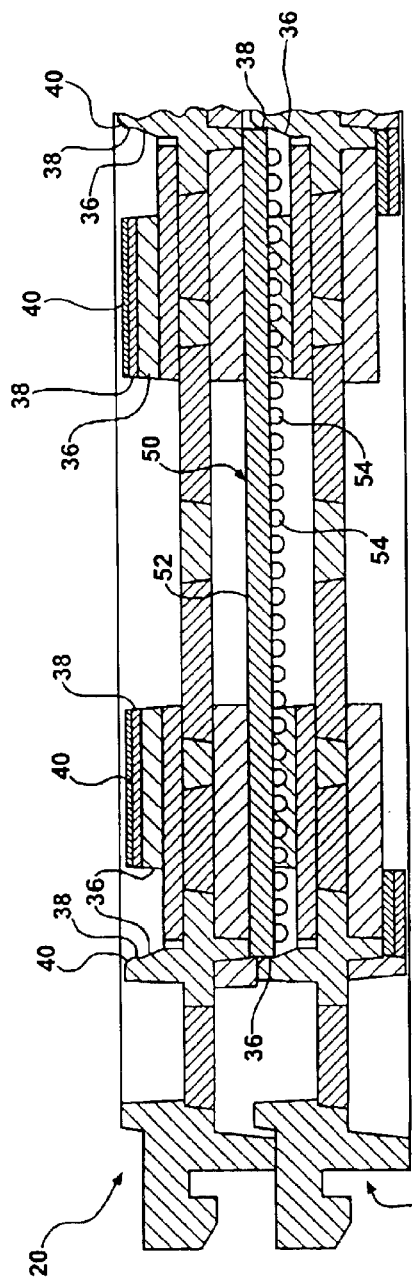
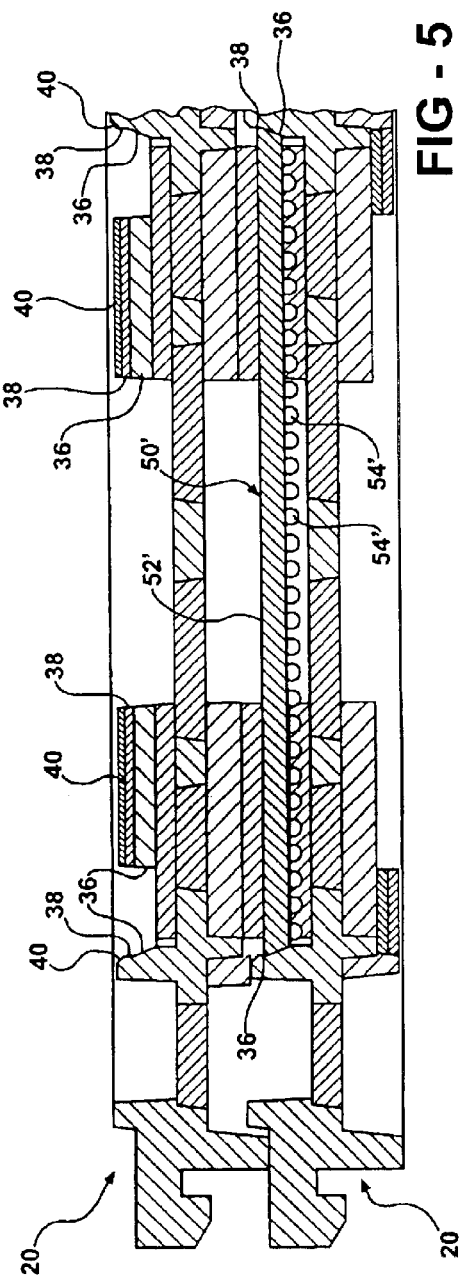

INTEGRATED CIRCUIT COMPONENT CARRIER WITH ANGLED SUPPORTING AND RETAINING SURFACES

CROSS REFERENCE TO RELATED APPLICATIONS

This application claims priority to U.S. Provisional Application No. 60/355,651, filed on Feb. 7, 2002.

BACKGROUND OF THE INVENTION

This invention generally relates to carriers for handling integrated circuit components. More particularly, this invention relates to integrated circuit component handling devices having retaining surfaces that cooperate with angular component support surfaces.

A variety of integrated circuit component carrier trays have been proposed. Some, because of certain advantages over others, have become more widely used. More recent advances in such tray designs are shown, for example, in U.S. Pat. No. 5,791,486, issued Aug. 11, 1998, and U.S. Pat. No. 5,957,293, issued Sep. 28, 1999. Each of these patents propose design elements that are intended to enhance the ability to carry the integrated circuit components within the trays and avoid contact between conductive connector members on the integrated circuit components and the tray supporting surfaces.

One challenge facing designers of such trays is to maintain a compact tray design, fit within industry standards on tray dimensions and to adequately support the integrated circuit components. Typical circuit components have a generally flat body portion with a number of conductive connecting members extending from one side of the body portion. The conductive connecting members typically are solder balls.

It is important during shipment or storage of such components to avoid contact with the conductive connector members to maintain the integrity of the component.

One shortcoming of current designs is that they do not adequately ensure that the circuit components will not shift during handling in a manner that allows the conductive members to contact the tray surfaces. Another shortcoming of current designs is that they do not accommodate as many integrated circuit components as desired within a given amount of space. Greater packaging density (i.e., more circuit components per unit volume) is desired.

This invention addresses the needs not satisfied by prior designs in providing a carrier for handling integrated circuit components that more effectively secures the components in a desired position throughout handling.

SUMMARY OF THE INVENTION

In general terms, this invention is a carrier for handling integrated circuit components including support surfaces and cooperating retaining surfaces that maintain a component in a desired position throughout handling.

One example carrier designed according to this invention includes at least one pocket having a generally planar base surface. A plurality of support surfaces extend away from the base surface at a first, oblique angle relative to the base surface. The support surfaces are arranged on the base surface such that the integrated circuit component is supported by the support surfaces. The integrated circuit component is spaced from (i.e., above) the base surface when properly received against the support surfaces. A retainer surface extends from each of at least some of the support surfaces at a second angle relative to the base surface. The retainer surfaces are operative to prevent the component from moving relative to the support surfaces more than an acceptable amount. The retainer surfaces, therefore, operate to keep the component from shifting out of a desired position within an acceptable range throughout handling of the carrier.

In one example, a guide surface is adjacent the retainer surfaces on an opposite side from the support surfaces. The guide surface is positioned at a third, oblique angle relative to the base surface. In one example, the guide surface and the support surfaces are at approximately the same angle.

In one example, the support surfaces are positioned between about 15° and 45° relative to the base surface while the retainer surfaces are positioned between about 90° and 75° relative to the base surface.

In another example, the retainer surfaces are an interruption on the support surfaces with at least a portion of the retainer surfaces being at a different angle relative to the base surface compared to the angle at which the support surfaces are positioned.

The various features and advantages of this invention will become apparent to those skilled in the art from the following detailed description of the currently preferred embodiments. The drawings that accompany the detailed description can be briefly described as follows.

BRIEF DESCRIPTION OF THE DRAWINGS

FIG. 4 is a cross-sectional illustration showing an example circuit component supported between two trays designed according to the embodiment of FIG. 2.

FIG. 5 is a cross-sectional illustration showing a second example circuit component supported between two trays designed according to the embodiment of FIG. 2.

DETAILED DESCRIPTION OF THE PREFERRED EMBODIMENTS

Figure 1:
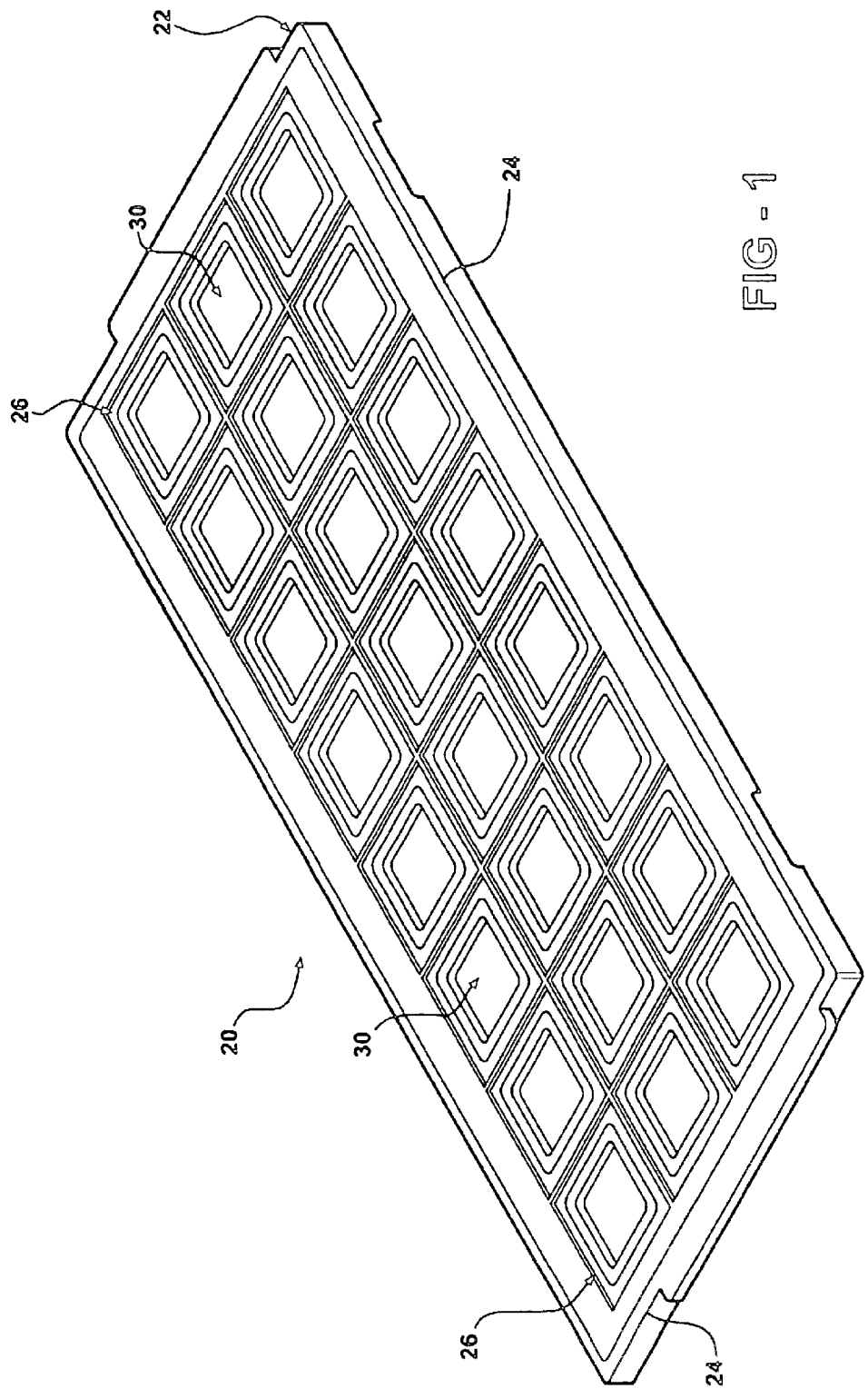
FIG. 1 schematically illustrates a tray designed according to this invention.

FIG. 1 schematically shows an integrated circuit component handling tray 20. The tray body 22 preferably is made from a plastic material that is sufficiently rigid and lightweight to support the integrated circuit components without adding undue mass. The parameter of the tray body 22 includes raised lip portions 24 that establish a recessed section 26 within the tray 20. The raised lip portions 24 cooperate with others on similar trays that are stacked on top of or adjacent each other as known in the art. The recessed portion 26 includes a plurality of containers or pockets 30, each of which is suited to support an individual integrated circuit component.

Figure 2:
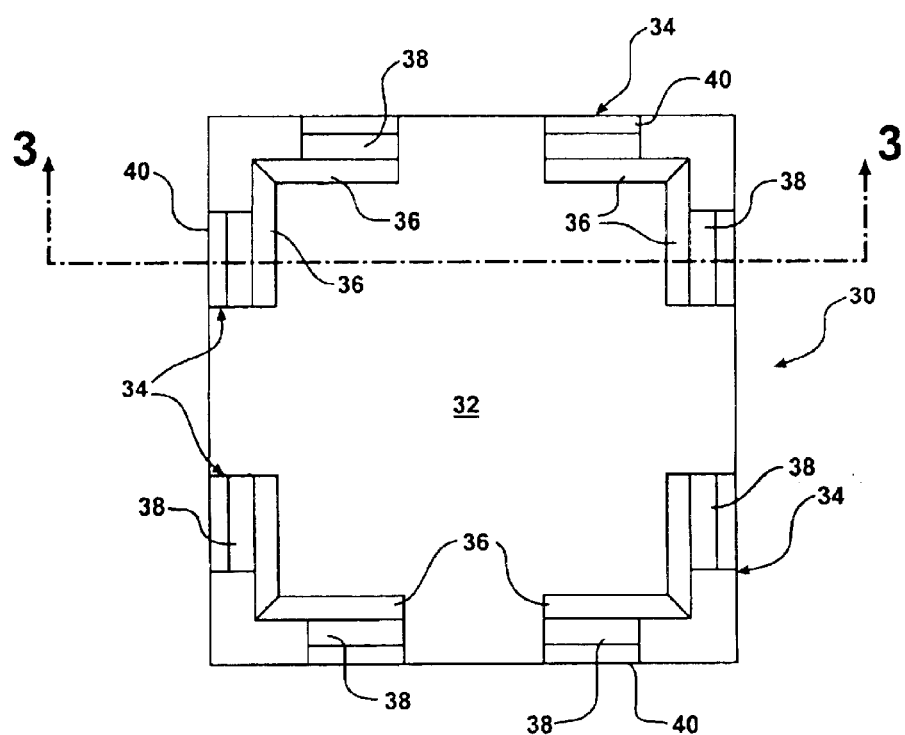
FIG. 2 is a top elevational view of a preferred container design on a tray.
Figure 3:
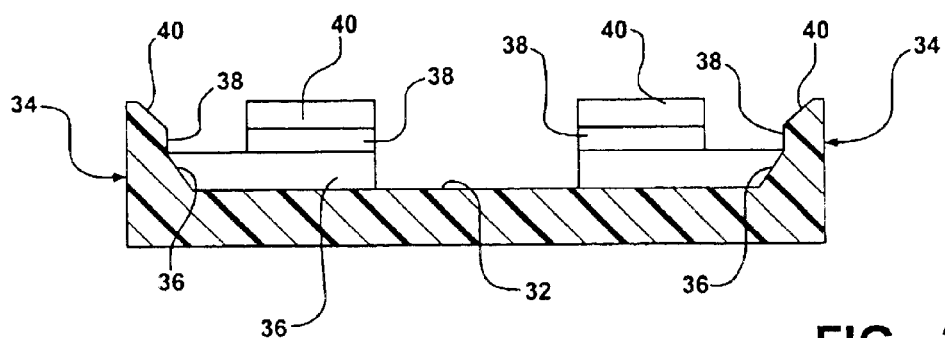
FIG. 3 is a cross-sectional illustration taken along the lines 3—3 in FIG. 2.

Referring to FIGS. 2 and 3, more details regarding an example of a currently preferred embodiment can be appreciated. The component pocket 30 includes a generally planar base surface 32. Although a generally continuous base surface is shown in the illustrated example for simplicity, those skilled in the art recognize that a variety of base surface configurations are possible. Different structures are within the scope of this invention that might provide additional material and weight savings compared to a continuous or completely solid base surface.

A plurality of sidewall portions 34 extend away from the base surface 32. As known in the art, the base surface of a plurality of adjacent pocket portions 30 are coplanar and the sidewall portions of one pocket are formed together with the sidewall portions of an adjacent pocket, depending on the pocket position in the tray.

The sidewall portions 34 each include a component support surface 36 that extends away from the base surface at a first, oblique angle relative to the base surface. The support surfaces 36 are positioned and adapted to receive and support the integrated circuit components in a manner such that the conductive connector members on the components do not contact the base surface 32 or the support surfaces 36. The support surfaces 36 are aligned relative to each other so that the component is received in a self-centering, self-aligning manner so that the desired component position within the pocket is automatically achieved upon placing the component within the pocket 30.

At least some of the sidewall portions 34 include a retainer surface 38 that meets with a corresponding support surface 36. The retainer surfaces 38 are aligned at a second angle relative to the base surface 32. The different angular alignments between the support surfaces 36 and the retainer surfaces 38 provide a cooperative relationship that maintains the integrated circuit components in a desired position within the pockets 30 throughout handling. In the illustrated example of FIG. 2, each support surface 36 has a corresponding retainer surface 38. In this example, the support surfaces 36 extend between the base surface 32 and the support surfaces 38.

Although the illustrated example includes eight retainer surfaces 38 in the pocket 30, at least four retainer surfaces are desired to ensure adequate retention of the component within the desired position during shipping. The retainer surfaces 38 preferably are positioned to allow some freedom of movement of the component within the pocket 30 but only within a small range so that there is no contact between the conductive connecting members and the base surface 32 or the support surfaces 36. Some small amount of movement is preferred to facilitate inserting and removing the components from the pockets.

The illustrated example includes guide surfaces 40 near the outermost portion of the pockets 30. The guide surfaces 40 preferably are aligned at an oblique angle relative to the base surface 32. The guide surfaces 40 facilitate inserting the components into the pockets 30.

The angular alignment of the support surfaces 36, retainer surfaces 38 and guide surfaces 40 preferably are such that there is enough of an angular difference between the orientation of the support surfaces 36 and the retainer surfaces 38 so that the two surfaces cooperate to maintain the component within a desired position inside the pocket 30 throughout handling. The angle of the guide surfaces 40 can be selected depending on the needs of a particular situation.

In one example, the support surfaces 36 preferably are within a range of about 15° and 45° relative to the base surface 32. In one preferred example, the support surfaces 36 are at a 30° angle relative to the base surface 32.

The retainer surfaces 38 preferably are aligned at an angle between about 90° and 75° relative to the base surface 32. In one preferred example, the retainer surface is at an angle of approximately 80° relative to the base surface. The retainer surfaces 38 preferably have a sufficiently different slope (relative to the base surface 32) compared to the support surfaces 36 so that the support surface angle is interrupted in a manner that the edges of the integrated circuit component are received against the retainer surfaces 38 to prevent further shifting of the component within the pockets 30.

In one example, the guide surfaces are aligned at the same angle as the support surfaces 36. In another example, the guide surfaces are at approximately 45° relative to the base surface 32 while the support surfaces 36 are at approximately 30° relative to the base surface 32.

A variety of configurations of cooperating support surfaces 36 and retainer surfaces 38 are within the scope of this invention. Moreover, a variety of integrated circuit component configurations are readily and effectively accommodated by a tray designed according to this invention. As shown in FIG. 4, a circuit component 50 has a body portion 52 and a plurality of conductive connector members 54 extending from one side of the body portion. The body portion 52 is generally planar and has squared edges as can be appreciated from the drawing. The edges of the perimeter of the body portion 52 are received against the support surfaces 36 in a manner that prevents the connector members 54 from contacting the base surface 32 or the support surfaces 36. The retainer surfaces 38 operate to maintain the component 50 within an acceptable range of movement within the pocket 30 throughout handling.

FIG. 5 shows another arrangement where an integrated circuit component 50' includes a body portion 52' and a plurality of connector members 54'. The body portion 52' includes angled surfaces along the perimeter of the body portion 52'. These angled surfaces are nestingly received against the support surfaces 36 so that the component 50' is adequately supported within the pocket 30 isolating the connector members 54 from contact with any of the tray surfaces. The retainer surfaces 38 again operate to retain the component within a desired range of motion within the pocket 30 so that no contact with the connector members 54' occurs during handling. This invention more effectively handles a variety of component configurations compared to previous designs.

Figure 6:
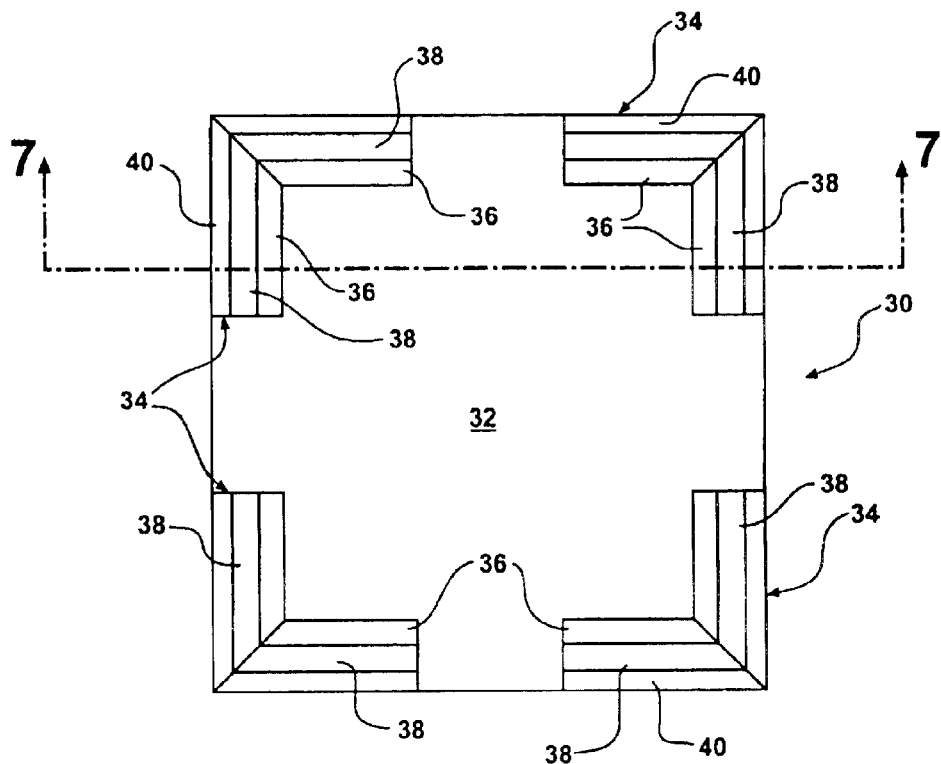
FIG. 6 is a top elevational view of an alternative embodiment of a tray container designed according to this invention.
Figure 7:
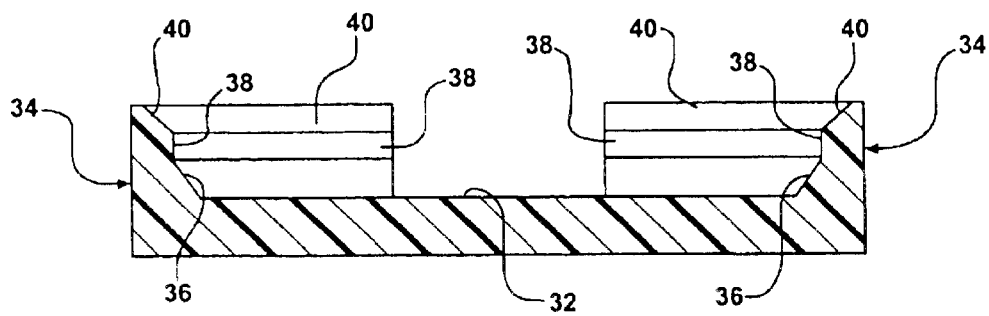
FIG. 7 is a cross-sectional illustration taken along the lines 7—7 in FIG. 6.

Another example arrangement is shown in FIGS. 6 and 7 where the portions 34 form right angle connections with adjacent sidewall portions as shown. In this example, the support surfaces 36 and the retainer surfaces 38 are aligned generally as was shown in the example discussed with respect to FIGS. 2 and 3. The difference between these two examples is the configuration at the intersections of the sidewall portions 34.

Figure 8:
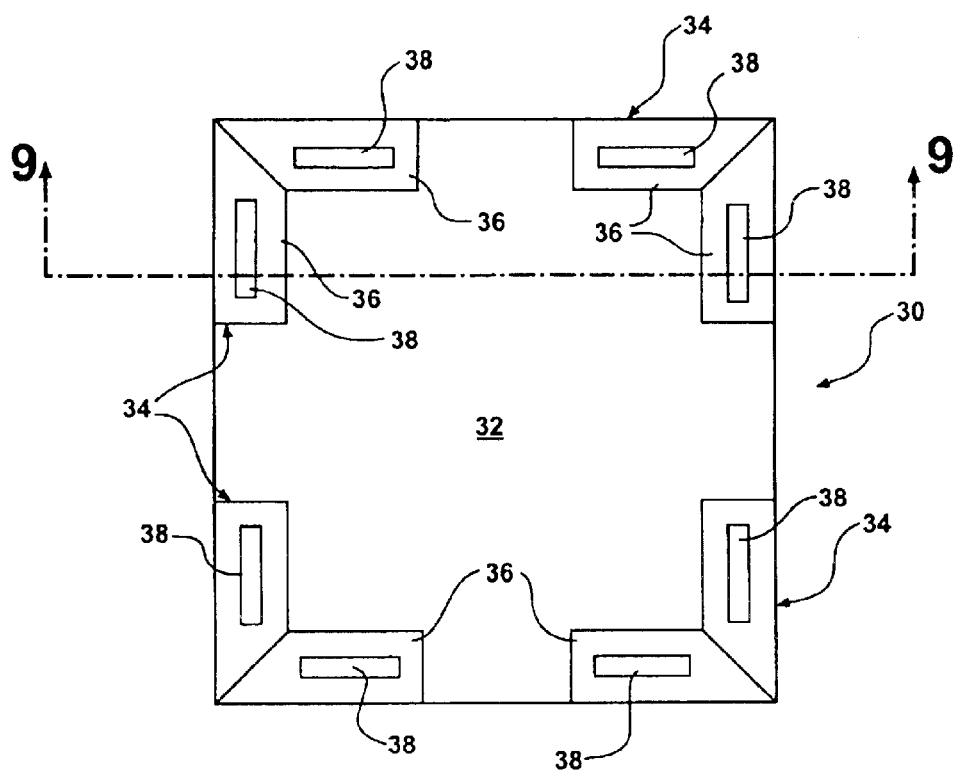
FIG. 8 is a top elevational view of another alternative embodiment container designed according to this invention.
Figure 9:
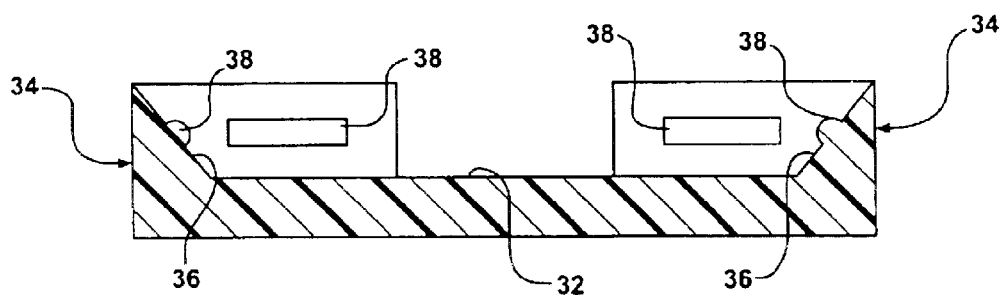
FIG. 9 is a cross-sectional illustration taken along the lines 9—9 in FIG. 8.

Another example is shown in FIGS. 8 and 9 where there are no guide surfaces 40. Another difference in this example is that the retainer surfaces 38 are not coextensive with each of the corresponding support surfaces 36. Instead, the retainer surfaces 38 in this example are partial interruptions in the support surfaces 36. At least a portion of each of these retainer surfaces 38 extends at a different angle relative to the base portion compared to the angle of alignment between the support surfaces 36 and the base surface 32.

In this illustrated example, the retainer surfaces 38 comprise rounded bumps formed on the support surfaces 36 in locations calculated to provide the desired amount of play for the component during handling. The angle of alignment of the retainer surfaces 38 relative to the base surface 32 can be determined by considering the tangent at a point along the rounded surface 38 such that the angular alignment of the retainer surface (i.e., the tangent) is at a different angle compared to that of the support surface 36.

Figure 10:
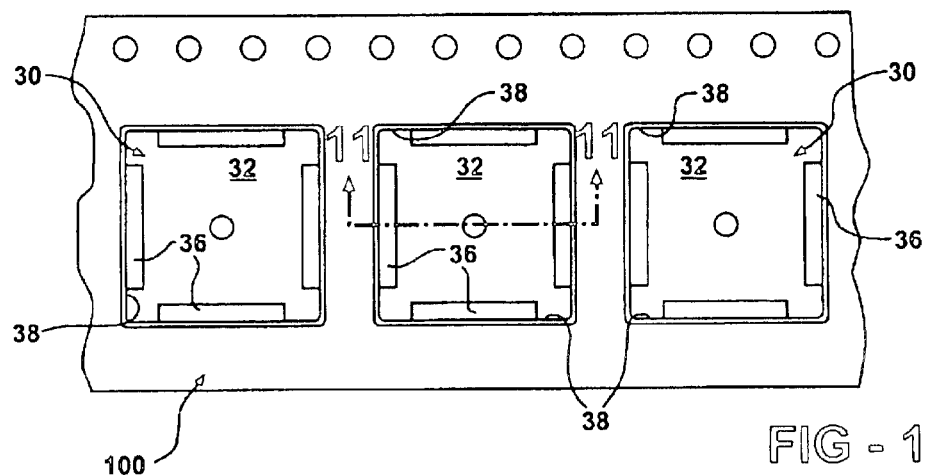
FIG. 10 schematically illustrates an example carrier tape designed according to this invention.
Figure 11:
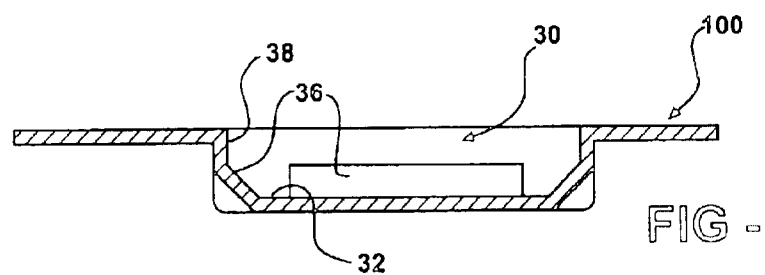
FIG. 11 is a cross sectional illustration taken along the lines 11—11 in FIG. 10.

FIGS. 10 and 11 show another carrier designed according to this invention. The carrier tape 100 includes a plurality of pockets 30 including support surfaces 36 and retainer surfaces 36 as described above. As known in the art carrier tapes differ from trays in that they support a row of integrated circuit components instead of in a matrix alignment. Additionally, the carrier tape 100 is capable of being wound around a conventional reel for shipping and storing the components supported by the tape.

Figure 12:
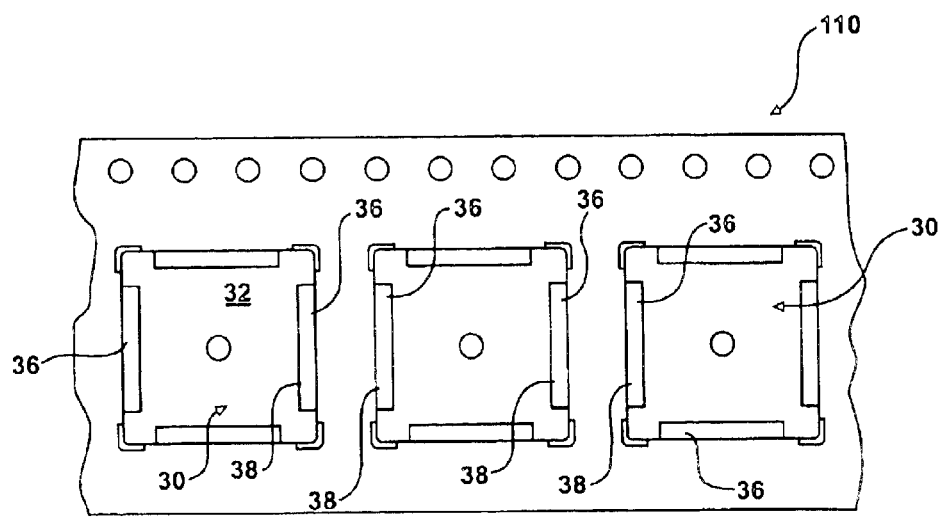
FIG. 12 schematically illustrates another example carrier tape designed according to this invention.

FIG. 12 shows another example carrier tape 110 designed according to this invention. In this example, the support surfaces extend throughout the pockets 30, which is different than the support surfaces in the example of FIGS. 10 and 11, which extend about three-quarters of the length of each side of the pockets 30. Both example carrier tapes are made using a commercially available polystyrene using known processes.

The angle of the retainer surfaces 38 in the carrier tape versions of a carrier designed according to this invention preferably is kept within a smaller range compared to the angle of the retainer surfaces on a tray version of the inventive carrier. In the illustrated examples, the retainer surfaces preferably are within a range from about 90° to about 85° relative to the base surface 32.

A variety of modifications, combinations and alterations of the illustrated examples are possible that come within the scope of this invention. Those skilled in the art who have the benefits of this description will be able to customize the angular arrangements and the dimensions of the various surfaces to meet the needs of their particular situation. Molding techniques and material selections may influence the choice of angular alignment and the particular components sought to be handled often will dictate the necessary configuration.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A device for supporting at least one integrated circuit component, comprising:
   a base surface;
   a plurality of generally planar surfaces extending away from the base surface at an oblique angle relative to the base surface, the planar surfaces establishing a component receiving pocket;
   at least one interruption comprising at least a bump in the planar surfaces for contacting an edge on a component received in the pocket to limit movement of the component relative to the planar surfaces, the planar surfaces having a first portion extending between the interruption and an inside edge near the base surface, the first portions operating as support surfaces for supporting a component in the pocket such that the component is spaced from the base surface, the planar surfaces having a second portion extending away from the interruption in an opposite direction from the first portion.

2. The device of claim 1, wherein the first and second portions of the planar surfaces are at the same oblique angle relative to the base surface.

3. The device of claim 1, wherein the second portions of the planar surfaces operate as guide surfaces to facilitate inserting a component into the pocket.

4. The device of claim 1, wherein the interruptions each comprise a retainer surface that extends across at least a portion of the corresponding planar surface.

5. The device of claim 1, wherein the interruptions are aligned parallel to the inside edge of the corresponding planar surface.

6. The device of claim 1, wherein the inside edge of each planar surface is directly adjacent the base surface.

7. The device of claim 6, wherein the inside edge of each planar surface is spaced from the base surface.

8. A device for supporting at least one integrated circuit component, comprising:
   a base surface;
   a plurality of generally planar surfaces extending away from the base surface at an obligue angle relative to the base surface, the planar surfaces establishing a component receiving pocket;
   at least one interruption in the planar surfaces for contacting an edge on a component received in the pocket to limit movement of the component relative to the planar surfaces, the planar surfaces having a first portion extending between the interruption and an inside edge near the base surface, the first portions operating as support surfaces for supporting a component in the pocket such that the component is space from the base surface, the planar surfaces having a second portion extending away from the interruption in an opposite direction from the first portion; and
   wherein the first portions of the planar surfaces are at a first oblique angle relative to the base surface and the second portions of the planar surfaces are at a second oblique angle relative to the base surface.

9. An assembly, comprising:
   a base surface;
   a plurality of support surfaces extending away from the base surface at an oblique angle relative to the base surface, the support surfaces being arranged on the base surface to establish a generally rectangular pocket; and
   a plurality of retainer surfaces associated with at least some of the support surfaces such that the retainer surfaces interrupt the support surfaces at a selected distance from the base surface; and
   at least one integrated circuit component that has a generally flat body with connector members extending away from one side of the body, the body having edges at an oblique angle that is approximately the same as the support surfaces angle such that the edges of the component body are aligned parallel to and at least partially supported by the support surfaces in the pocket and the connector members do not contact the base surface, the retainer surfaces being operative to prevent the component from moving relative to the support surfaces more than an acceptable amount.

10. The assembly of claim 9, wherein the retainer surfaces comprise generally planar surfaces extending from an end of the corresponding support surfaces distal from the base surface.

11. The assembly of claim 9, wherein the retainer surfaces comprise bumps on the support surfaces.

12. The assembly of claim 9, including a plurality of guide surfaces operative to guide the component toward a seated position on the support surfaces, the retainer surfaces being between the guide and support surfaces.

13. The assembly of claim 9, wherein every support surface has a corresponding retainer surface.

14. The assembly of claim 9, wherein each support surface has an inside edge near the base surface and wherein each retainer surface is aligned in a direction parallel to the corresponding inside edge.

15. The assembly of claim 9, wherein each support surface has an inside edge that is directly adjacent the base surface.

16. The assembly of claim 9, wherein each support surface has an inside edge that is spaced from the base surface.

* * * * *

UNITED STATES PATENT AND TRADEMARK OFFICE
CERTIFICATE OF CORRECTION

PATENT NO. : 6,809,936 B2
APPLICATION NO. : 10/140089
DATED : October 26, 2004
INVENTOR(S) : Song Ping Chen, Ru Zheng Liu and Yam Lau It is certified that error appears in the above-identified patent and that said Letters Patent is hereby corrected as shown below:

Claim 8, Col. 6, line 31: "obligue" should read as --oblique--

Claim 8, Col. 6, line 41: "space" should read as --spaced--

Signed and Sealed this

Fourth Day of November, 2008

JON W. DUDAS
*Director of the United States Patent and Trademark Office*